(12) United States Patent
Lee et al.

(10) Patent No.: US 11,018,323 B2
(45) Date of Patent: May 25, 2021

(54) ORGANIC LIGHT-EMITTING DIODE DISPLAY INCLUDING A LAYER HAVING AN INCLINED PORTION

(71) Applicant: Samsung Display Co., Ltd., Yongin-si (KR)

(72) Inventors: Baek Hee Lee, Yongin-si (KR); Min Ki Nam, Anseong-si (KR); Hae Il Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 590 days.

(21) Appl. No.: 15/334,774

(22) Filed: Oct. 26, 2016

(65) Prior Publication Data
US 2017/0125740 A1    May 4, 2017

(30) Foreign Application Priority Data
Oct. 30, 2015  (KR) .......................... 10-2015-0152548

(51) Int. Cl.
*H01L 51/52* (2006.01)
*H01L 27/32* (2006.01)

(52) U.S. Cl.
CPC ........ *H01L 51/5271* (2013.01); *H01L 27/322* (2013.01); *H01L 27/3246* (2013.01); *H01L 27/3248* (2013.01); *H01L 27/3258* (2013.01); *H01L 51/524* (2013.01); *H01L 51/5209* (2013.01); *H01L 51/5218* (2013.01);
(Continued)

(58) Field of Classification Search
CPC ................................................... H04N 13/366
See application file for complete search history.

(56) References Cited

U.S. PATENT DOCUMENTS

| 6,608,439 B1 | 8/2003 | Sokolik et al. |
| 9,184,403 B2 | 11/2015 | Cho et al. |
(Continued)

FOREIGN PATENT DOCUMENTS

| KR | 10-2010-0041122 A | 4/2010 |
| KR | 10-2012-0045968 A | 5/2012 |
| KR | 10-2014-0046840 A | 4/2014 |

OTHER PUBLICATIONS

Cho et al., "Highly efficient phosphor-converted white organic light-emitting diodes with moderate microcavity and light-recycling filters," *Optics Express*, Jan. 18, 2010, vol. 18, No. 2, pp. 1099-1104.
(Continued)

*Primary Examiner* — Lex H Malsawma
*Assistant Examiner* — Geoffrey H Ida
(74) *Attorney, Agent, or Firm* — Lewis Roca Rothgerber Christie LLP

(57) ABSTRACT

An organic light-emitting diode (OLED) display is disclosed. In one aspect, the OLED display includes a first substrate, an insulating layer disposed over the first substrate and including a first inclined portion and a first electrode disposed over the insulating layer. The OLED display also includes a light-emitting element layer disposed over the first electrode, a second electrode disposed over the light-emitting element layer and a color conversion layer and a transmissive layer disposed over the second electrode. The first electrode includes a second inclined portion disposed over and inclined along the first inclined portion of the insulating layer.

30 Claims, 10 Drawing Sheets

(52) U.S. Cl.
CPC ...... *H01L 51/5268* (2013.01); *H01L 51/5278* (2013.01); *H01L 51/5284* (2013.01); *H01L 2251/5315* (2013.01); *H01L 2251/5369* (2013.01)

(56) References Cited

U.S. PATENT DOCUMENTS

| | | | | |
|---|---|---|---|---|
| 2004/0113550 A1* | 6/2004 | Adachi | ............... | H01L 51/525 |
| | | | | 313/512 |
| 2005/0225232 A1* | 10/2005 | Boroson | ............. | H01L 51/5265 |
| | | | | 313/504 |
| 2007/0201056 A1* | 8/2007 | Cok | ............... | B82Y 20/00 |
| | | | | 358/1.9 |
| 2008/0169461 A1* | 7/2008 | Park | ............... | H01L 27/3246 |
| | | | | 257/40 |
| 2011/0298953 A1* | 12/2011 | Nakamura | ........... | H04N 13/366 |
| | | | | 348/241 |
| 2015/0076457 A1 | 3/2015 | Kwon et al. | | |
| 2015/0102325 A1 | 4/2015 | Lim et al. | | |

OTHER PUBLICATIONS

Dantelle et al., "How to Prepare the Brightest Luminescent Coatings?", ds.doi.org/10.1021/am4035448 | *ACS Appl. Mater. Interfaces* 2013, 5, pp. 11315-11320.

* cited by examiner

ORGANIC LIGHT-EMITTING DIODE DISPLAY INCLUDING A LAYER HAVING AN INCLINED PORTION

CROSS-REFERENCE TO RELATED APPLICATION

This application claims priority to and the benefit of Korean Patent Application No. 10-2015-0152548 filed in the Korean Intellectual Property Office on Oct. 30, 2015, the entire contents of which are incorporated herein by reference.

BACKGROUND

Field

The described technology generally relates to an organic light-emitting diode (OLED) display.

Description of the Related Technology

An OLED display includes organic light-emitting elements that include a hole injection electrode, an organic emission layer, and an electron injection electrode. Each organic light-emitting element emits light using energy generated when excitons, which are created by combining electrons with holes, fall from an excited state to a ground state inside the organic emission layer, and using such light emission, the combination of pixels (including the OLED) can display a predetermined image.

An OLED display generally has a structure in which an anode and a cathode are disposed to face each other on an insulating layer covering a thin film transistor provided on a substrate and in which an organic emission layer is disposed between the anode and the cathode. However, since light generated from the organic emission layer is partially or totally reflected between the organic emission layer and one of the electrodes, efficiency of light transmitted to the environment is reduced.

In addition, color shift caused by the color shade (hue) varying in dependence on the angle between the viewer and the display may occur.

The above information disclosed in this Background section is only to enhance the understanding of the background of the disclosure and therefore it may contain information that does not form the prior art that is already known in this country to a person of ordinary skill in the art.

SUMMARY OF CERTAIN INVENTIVE ASPECTS

One inventive aspect relates to an OLED display that can improve color reproducibility and reduce color shift associated with a viewing angle.

Another aspect is an OLED display that includes: a first substrate; an insulating layer disposed over the first substrate and having an first inclined portion; a first electrode disposed over the insulating layer; a light-emitting element layer disposed over the first electrode; a second electrode disposed over the light-emitting element layer; and a color conversion layer and a transmissive layer disposed over the second electrode. The first electrode includes a second inclined portion disposed over and inclined along the first inclined portion of the insulating layer based on a surface substantially parallel to the first substrate.

The OLED display may further include a passivation layer disposed between the first substrate and the insulating layer, wherein the second inclined portion of the first electrode disposed in the inclined portion of the insulating layer may be extended such that the first electrode is disposed over the passivation layer.

The OLED display may further include a pixel defining layer disposed over the insulating layer, wherein the pixel defining layer may overlap a side surface of the inclined portion in the depth dimension of the OLED display.

The pixel defining layer may include scattering particles having a nano-structure that are dispersed.

The scattering particles may include at least one selected from the group consisting of inorganic particles and polymer particles.

The inclined portion may have at least one of the first and second inclined portions has an acute inclination angle with respect to the first substrate.

The first electrode may include a reflecting electrode.

The first electrode may include a plurality of protrusions.

The insulating layer may include a protrusion-depression structure that corresponds to the protrusions of the first electrode.

The color conversion layer may include at least one of a quantum dot and a phosphor.

The color conversion layer may include a red color conversion media layer and a green color conversion media layer, and the color conversion layer may further include a light blocking member that is disposed between the red color conversion media layer and the green color conversion media layer, between the red color conversion media layer and the transmissive layer, and between the green color conversion media layer and the transmissive layer.

The OLED display may further include a blue light-cutting filter that overlaps the red color conversion media layer and the green color conversion media layer in the depth dimension of the OLED display.

The light-emitting element layer may include a plurality of blue emission layers that respectively correspond to the red color conversion media layer, the green color conversion media layer, and the transmissive layer.

The red color conversion media layer and the green color conversion media layer may respectively include at least one of the quantum dot and the phosphor, and the transmissive layer may not include the quantum dot and the phosphor.

At least one of the red color conversion media layer, the green color conversion media layer, and the transmissive layer may include a plurality of scatterers.

The OLED display may further include a capping layer that is disposed between the second electrode and the color conversion layer and between the second electrode and the transmissive layer.

The OLED display may further include a second substrate that is disposed over the color conversion layer and the transmissive layer.

The OLED display may further include a pixel defining layer disposed over the insulating layer, wherein the color conversion layer and the transmissive layer may be disposed between the pixel defining layers.

The light-emitting element layer may include a blue emission layer that has a tandem structure.

Another aspect is an OLED display that includes: a first substrate; an insulating layer disposed over the first substrate; an organic light-emitting element disposed over the insulating layer; a color conversion layer and a transmissive layer disposed over the organic light-emitting element; and a reflective metal layer disposed over the color conversion layer and the transmissive layer. The reflective metal layer includes an inclined portion.

The color conversion layer may include a red color conversion media layer and a green color conversion media layer, and the color conversion layer may further include a light blocking member disposed between the red color conversion media layer and the green color conversion media layer, between the red color conversion media layer and the transmissive layer, and between the green color conversion media layer and the transmissive layer.

The inclined portion of the reflective metal layer may be disposed between the light blocking member and the red color conversion media layer, between the light blocking member and the green color conversion media layer, and between the light blocking member and the transmissive layer.

The OLED display may further include a blue light-cutting filter that overlaps the red color conversion media layer and the green color conversion media layer in the depth dimension of the OLED display.

The OLED display may further include a second substrate that is disposed over the light blocking member and the reflective metal layer.

The organic light-emitting element may include a light-emitting element layer, and the light-emitting element layer may include a plurality of blue emission layers that respectively correspond to the red color conversion media layer, the green color conversion media layer, and the transmissive layer.

The red color conversion media layer and the green color conversion media layer may respectively include at least one of the quantum dot and the phosphor, and the transmissive layer may not include the quantum dot and the phosphor.

At least one of the red color conversion media layer, the green color conversion media layer, and the transmissive layer may include a plurality of scatterers.

The reflective metal layer may include a plurality of protrusions.

The OLED display may further include an auxiliary layer that is disposed over the reflective metal layer, wherein the auxiliary layer may include a protrusion-depression structure that corresponds to the plurality of protrusions.

The organic light-emitting element may include: a first electrode disposed over the insulating layer; a light-emitting element layer disposed over the first electrode; and a second electrode disposed over the light-emitting element layer. A top surface of the insulating layer may have a structure that is smooth.

According to at least one of the disclosed embodiments, the OLED display with improved color reproducibility and reduced color shift can be implemented.

DETAILED DESCRIPTION OF CERTAIN INVENTIVE EMBODIMENTS

Figure 1:
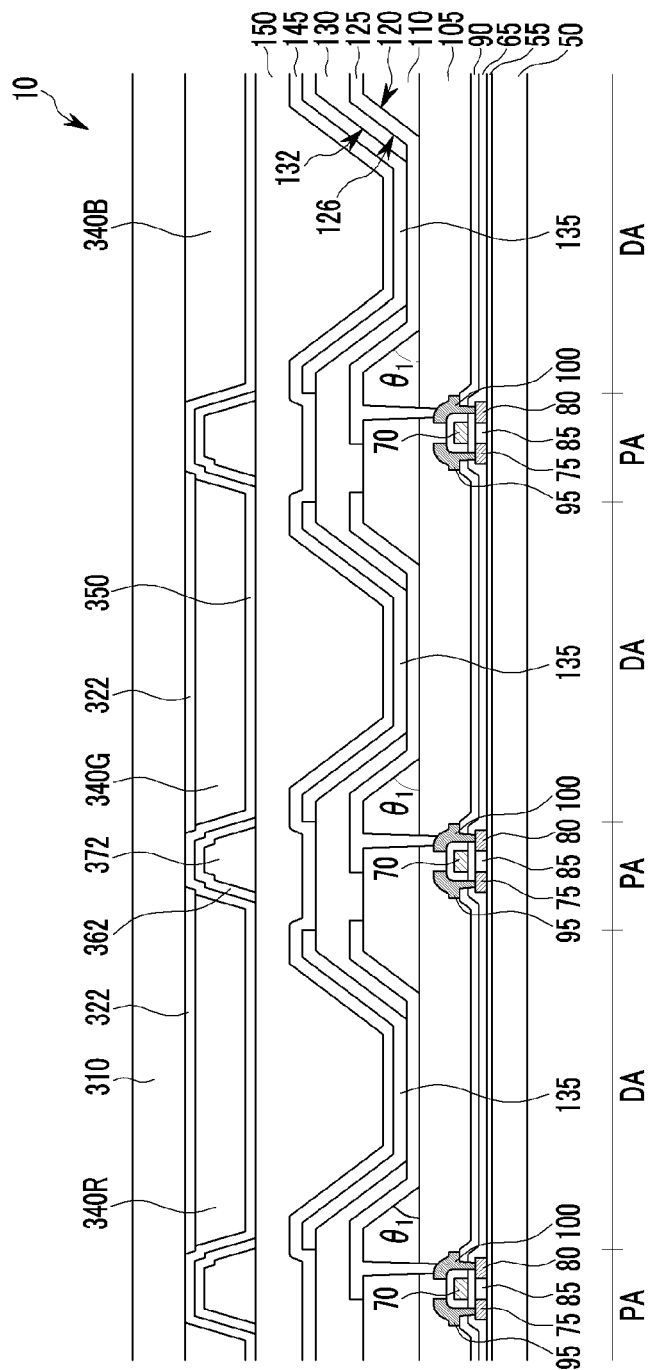
FIG. 1 is a cross-sectional view of an OLED display according to an exemplary embodiment.

Embodiments will be described more fully hereinafter with reference to the accompanying drawings. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thickness of layers, films, panels, regions, etc. are exaggerated for clarity. In the drawings, for ease of description, the thicknesses of some layers and regions are exaggerated.

In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Further, throughout the specification, the word "on a plane" means viewing a target portion from the top, and the word "on a cross-section" means viewing a cross-section formed by vertically cutting a target portion from the side.

Figure 2:
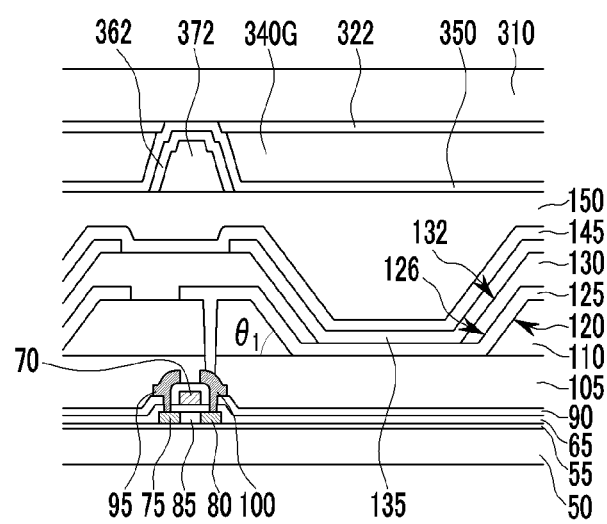
FIG. 2 is a cross-sectional view of a green pixel area in the exemplary embodiment of FIG. 1.
Figure 3:
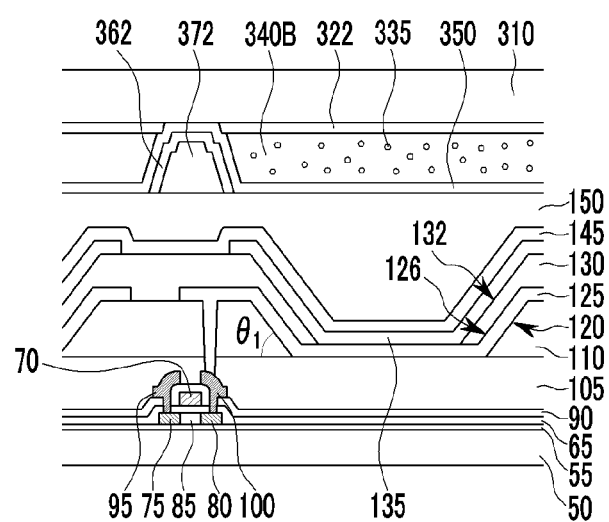
FIG. 3 is a cross-sectional view of a blue pixel area in the exemplary embodiment of FIG. 1.
Figure 4:
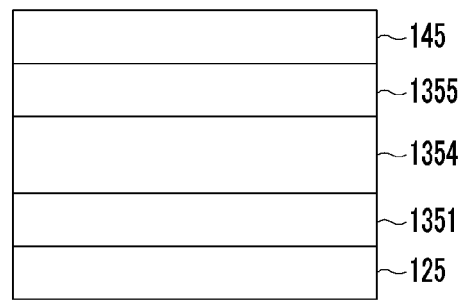
FIG. 4 is a cross-sectional view of an organic light-emitting element of the OLED display of FIG. 1.

FIG. 1 is a cross-sectional view of an OLED display 10 according to an exemplary embodiment. FIG. 2 is a cross-sectional view of a green pixel area in the exemplary embodiment of FIG. 1. FIG. 3 is a cross-sectional view of a blue pixel area in the exemplary embodiment of FIG. 1. FIG. 4 is a cross-sectional view of an organic light-emitting element of the OLED display of FIG. 1.

Referring to FIG. 1, the OLED display includes 10 a buffer layer 55 disposed over a first substrate 50. The first substrate may be transparent.

The buffer layer 55 may perform a function of preventing diffusion of metal atoms, impurities, and the like from the first substrate 50. For example, the buffer layer 55 may include a silicon oxide, a silicon nitride, a silicon oxynitride, a silicon oxycarbide, a silicon carbonitride, etc. The buffer layer 55 may be omitted.

A semiconductor layer is disposed over the buffer layer 55. The semiconductor layer may include a plurality of extrinsic regions including an n-type or p-type conductive impurity, and at least one intrinsic region including no conductive impurity.

In the semiconductor layer, the extrinsic regions includes source and drain regions 75 and 80, which are doped with a p-type impurity and are separated from each other. A channel region 85 is provided between the source region 75 and the drain region 80. Alternatively, the extrinsic regions 75 and 80 of the semiconductor layer may be doped with an n-type impurity.

A gate insulating layer 65 is disposed over the semiconductor layer and the buffer layer 55. The gate insulating layer 65 can be made of a silicon oxide or a silicon nitride.

A gate electrode 70 is disposed over the gate insulating layer 65. The gate electrode 70 is disposed over a portion of the gate insulating layer 65 below which the semiconductor layer is disposed.

Though not illustrated, along with the gate electrode 70, a gate line connected to the gate electrode 70 is disposed over the gate insulating layer 65.

An interlayer insulating layer 90 covering the gate electrode 70 is disposed over the gate insulating layer 65. The interlayer insulating layer 90 may be formed over gate insulating layer 65 to have a uniform thickness according to a profile of the gate electrode 70. Accordingly, a step portion adjacent to the gate electrode 70 may be formed in the interlayer insulating layer 90. A silicon compound including a silicon oxide, a silicon nitride, a silicon oxynitride, etc. may be used to form the interlayer insulating layer 90. The interlayer insulating layer 90 may perform a function of insulating the gate electrode 70 from source and drain electrodes 95 and 100 to be described below.

The source electrode 95 and the drain electrode 100 are disposed over the interlayer insulating layer 90. The source and drain electrodes 95 and 100 are separated based on the gate electrode 70 while having a predetermined gap therebetween, and are disposed adjacent to the gate electrode 70. For example, the source and drain electrodes 95 and 100 may be respectively extended from the interlayer insulating layer 90 disposed over the source and drain regions 75 and 80 to the interlayer insulating layer 90 disposed over the gate electrode 70. In addition, the source and drain electrodes 95 and 100 penetrate the interlayer insulating layer 90 such that they are respectively connected to the source and drain regions 75 and 80.

The source and drain electrodes 95 and 100 may respectively include a metal, an alloy, a metal nitride, a conductive metal oxide, a transparent conductive material, etc.

Though not illustrated, a data line crossing the gate line is disposed over the interlayer insulating layer 90 such that it is connected to the source electrode 95.

A passivation layer 105 is disposed over the source electrode 95 and the drain electrode 100. The passivation layer 105 may have a sufficient thickness to completely cover the source electrode 95 and the drain electrode 100. The passivation layer 105 may include an organic material, an inorganic material, etc.

In some embodiments, as shown in FIG. 1, the OLED display 10 includes an insulating layer 110 having an first inclined portion 120 and disposed over the passivation layer 105. A contact hole, which also penetrates the passivation layer 105 to partially expose the drain electrode 100, is formed in the insulating layer 110. The drain electrode 100 may be electrically connected to a first electrode 125 to be described below via the contact hole.

The insulating layer 110 according to the current exemplary embodiment has a partially depressed portion. The partially depressed portion may, as shown in FIG. 2, expose some of a top surface of the passivation layer 105. A side surface connecting the partially depressed portion of the insulating layer 110 to the other portion of the insulating layer 110 that is not depressed may form the first inclined portion 120. In the current exemplary embodiment, the first inclined portion 120 has a first inclination angle $\theta_1$, and the first inclination angle $\theta_1$ may be an acute angle, i.e., greater than 0 degrees and smaller than 90 degrees. The first inclination angles $\theta_1$ of the three respective emission areas DA illustrated in FIG. 1 are illustrated to be the same as each other, but in order to improve color shift associated with a viewing angle, the inclination angles of the respective emission areas may be designed to be different from each other.

The first electrode 125 is disposed over the insulating layer 110. The first electrode 125 is filled into the contact hole described above such that it is connected to the drain electrode 100. In the current exemplary embodiment, the first electrode 125 covers the partially depressed portion of the insulating layer 110, and includes an second inclined portion 126 that is disposed along the first inclined portion 120. The second inclined portion 126 of the first electrode 125 may be inclined based on a surface that is substantially parallel to the first substrate 50. In this case, the second inclined portion 126 of the first electrode 125 may cover most of the first inclined portion 120 of the insulating layer 110. In addition, as illustrated in FIG. 2, the first electrode 125 may contact the top surface of the passivation layer 105 in the partially depressed portion of the insulating layer 110.

The OLED display including the insulating layer 110 having the first inclined portion 120 as in the current exemplary embodiment may be a top emission type in which light is finally emitted in a direction toward the insulating layer 110 from the first substrate 50. In this case, the first electrode 125 may include a reflective material. For example, the first electrode 125 may include a metal such as aluminum, silver, platinum, gold (Au), chromium (Cr), tungsten (W), molybdenum (Mo), titanium (Ti), palladium (Pd), and iridium (Ir), an alloy thereof, etc. They may be used alone or in combination. In addition, the first electrode 125 may have a single-layered structure or a multi-layered structure including the metal and/or the alloy described above. Alternatively, the first electrode 125 may have a structure such as a triple layer structure of silver (Ag)/indium tin oxide (ITO)/silver (Ag).

A pixel defining layer 130 is disposed over the insulating layer 110 and the first electrode 125. The pixel defining layer 130 may overlap a side surface of the first inclined portion 120 in the depth dimension of the OLED display. The pixel defining layer 130 may be formed of an organic material, an inorganic material, etc. For example, the pixel defining layer 130 may include an organic material such as a photoresist, a polyacrylate resin, a polyimide resin, an acryl-based resin, etc., or an inorganic material such as a silicon compound. In one exemplary embodiment, the pixel defining layer 130 may also be formed of a photoresist including a black pigment, in which case the pixel defining layer 130 may serve as a light blocking member.

Scattering particles having a nano-structure may be dispersed in the pixel defining layer 130. The scattering particles may include at least one selected from the group consisting of inorganic particles and polymer particles. For example, the scattering particles may include inorganic particles such as silica, $TiO_2$, $ZrO_2$, etc., or polymer particles such as polystyrene, polymethyl methacrylate (PMMA), etc.

An opening 132 exposing some of the first electrode 125 is formed in the pixel defining layer 130. A side surface of the pixel defining layer 130 formed by the opening 132 may have an inclined structure, and an inclination angle of the inclined structure may be substantially the same or similar to the first inclination angle $\theta_1$ of the insulating layer 110. A range being substantially the same or similar may correspond to a difference being greater than 0 degrees and smaller than about 5 degrees. Unlike the exemplary embodiment described above, the inclination angle of the pixel defining layer 130 having the inclined structure may be different from the first inclination angle $\theta_1$ regardless of the first inclination angle $\theta_1$ of the insulating layer 110.

The pixel defining layer 130 may define an emission area DA and a non-emission area PA in the OLED display. An area where the opening 132 of the pixel defining layer 130 is disposed corresponds to the emission area DA, while an area where the pixel defining layer 130 except for the opening 132 is disposed corresponds to the non-emission area PA. The emission area DA may correspond to a portion of an organic element layer 135 to be described below from which light is emitted, while the non-emission area PA may correspond to the rest of the area other than the emission area DA.

Most of the first inclined portion 120 of the insulating layer 110 is disposed in the emission area DA, and the first electrode 125 is disposed in the emission area DA to cover a side surface of the first inclined portion 120. In this case, the pixel defining layer 130 covers a portion of the first electrode 125 in the emission area DA that covers the side surface of the first inclined portion 120.

A light-emitting element layer 135 is disposed over the first electrode 125 that is disposed in the emission area DA, and a second electrode 145 is disposed over the light-emitting element layer 135. The first electrode 125, the light-emitting element layer 135, and the second electrode 145 may configure the organic light-emitting element.

In the exemplary embodiment illustrated in FIG. 1, the light-emitting element layer 135 extends along the side surface of the inclined structure of the pixel defining layer 130 such that it is disposed over some of a top surface of the pixel defining layer 130. However, in a modified exemplary embodiment, the light-emitting element layer 135 is disposed only in a portion of the first electrode 125 substantially exposed by the opening 132, or is disposed only in a portion of the first electrode 125 exposed by the opening 132 and extends therefrom to be disposed only at an inclined side surface of the pixel defining layer 130.

The light-emitting element layer 135 according to the current exemplary embodiment included a multi-layered structure including a hole injection layer, a hole transporting layer, an organic emission layer, an electron transporting layer, an electron injection layer, etc. The organic emission layer may be formed in each pixel by laminating a material for generating blue light or by laminating a plurality of light-emitting materials for generating white light.

In this regard, an organic light-emitting element according to an exemplary embodiment of the present disclosure will now be described with reference to FIG. 4.

Referring to FIG. 4, the organic light-emitting element includes a hole transporting region 1351 disposed over the first electrode 125, an organic emission layer 1354 disposed over the hole transporting region 1351, an electron transporting region 1355 disposed over the organic emission layer 1354, and the second electrode 145 disposed over the electron transporting region 1355.

The hole transporting region 1351 may include an auxiliary layer that is disposed between the first electrode 125 and the emission layer 1354. The hole transporting region 1351 may include at least one of the hole transporting layer and the hole injection layer. The hole transporting layer may perform a function of efficiently transporting holes transferred from the first electrode 125. The hole transporting layer may include an organic material. For example, the hole transporting layer may include N,N-dinaphthyl-N,N'-diphenyl benzidine (NPD), TPD (N,N'-bis-(3-methylphenyl)-N, N'-bis-(phenyl)-benzidine), s-TAD, 4,4',4"-tris-(N-3-methylphenyl-N-phenyl-amino)-triphenylamine (MTDATA), and the like, but it is not limited thereto.

The organic emission layer 1354 may include a material that emits blue light. A material for forming the organic emission layer 1354 is not specifically limited. Specifically, the organic emission layer 1354 may be made of oxadiazole dimer dyes (bis-DAPDXP), spiro compounds (spiro-DPVBi, spiro-6P), triarylamine compounds, bis(styryl)amine (DPVBi, DSA), 4,4'-bis(9-ethyl-3-carbazovinylene)-1, 1'-biphenyl (BCzVBi), perylene, 2,5,8,11-tetra-tert-butylperylene (TPBe), 9H-carbazol-3,3'-(1,4-phenylene-di-2,1-ethene-diyl)bis[9-ethyl-9C] (BCzVB), 4,4-bis[4-(di-p-tolylamino)styryl]biphenyl (DPAVBi), 4-(di-p-tolylamino)-4'-[(di-p-tolylamino)styryl] stilbene (DPAVB), 4,4'-bis[4-(diphenylamino)styryl]biphenyl (BDAVBi), bis(3,5-difluoro-2-(2-pyridyl)phenyl-(2-carboxypyridyl)iridium III (FIrPic), etc.

The organic emission layer 1354 may further include a dopant that is added to a host.

Figure 5:
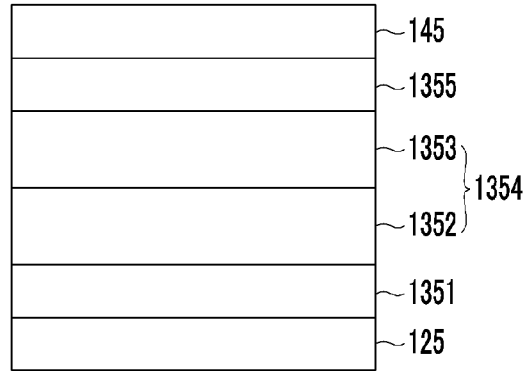
FIG. 5 is a cross-sectional view of a tandem structure in which the organic light-emitting element of FIG. 4 is modified.

FIG. 5 is a cross-sectional view of a tandem structure in which the organic light-emitting element of FIG. 4 is modified.

Referring to FIG. 5, the organic light-emitting element according to the current exemplary embodiment has a tandem type of structure. For example, the organic emission layer 1354 may include two layers 1352 and 1353 that respectively emit the same color or different colors. The two layers 1352 and 1353 respectively emitting the same color may be blue emission layers. The two layers 1352 and 1353 emitting different colors may be mixed to emit a color that represents white. For example, one of the two layers 1352 and 1353 may be a blue emission layer, while the other may be a yellow emission layer. While not being limited thereto, the organic emission layer 1354 may include three layers that respectively emit different colors, and in this case, the three layers may respectively emit red, green, and blue or blue, yellow, and blue.

Though not illustrated, a charge generation layer may be disposed between the two layers 1352 and 1353. The charge generation layer is generally formed between the neighboring emission layers, serving to control charge balance between the adjacent emission layers.

Referring back to FIG. 4, the electron transporting region 1355 may be disposed over the organic emission layer 1354. The electron transporting region 1355 may include the auxiliary layer that is disposed between the organic emission layer 1354 and the second electrode 145. The electron transporting region 1355 may include at least one of the electron transporting layer and the electron injection layer. In this case, the electron transporting layer may include an organic material. For example, the electron transporting layer may be made of at least one selected from a group of tris(8-hydroxyquinolino)aluminum (Alq3), 2-[4-biphenyl-5-[4-tert-butylphenyl]]-1,3,4-oxadiazole (PBD), 1,2,4-triazole (TAZ), spiro-2-[4-biphenyl-5-[4-tert-butylphenyl]]-1,3,4-oxadiazole (spiro-PBD), and 8-hydroxyquinoline beryllium salt (BAlq), but it is not limited thereto.

Referring back to FIG. 1, the second electrode 145 is disposed over the light-emitting element layer 135 and the pixel defining layer 130. The second electrode 145 may include a transparent conductive material. For example, the second electrode 145 may include an indium tin oxide, an indium zinc oxide, a zinc tin oxide, a zinc oxide, a tin oxide, a gallium oxide, etc., or may include Liq/Al. They may be used alone or in combination.

As shown in FIG. 1, the second electrode 145 may be extended from the emission area DA to the non-emission area PA. The second electrode 145 is not limited thereto, and it may be disposed in the emission area DA or only at a top surface of the light-emitting element layer 135.

A capping layer 150 is disposed over the second electrode 145. The capping layer 150 may be extended from the emission area DA to the non-emission area PA. The capping layer 150 may be formed of an organic material, an inorganic material, etc. For example, the capping layer 150 may include a photoresist, an acryl-based polymer, a polyimide-based polymer, a polyamide-based polymer, a siloxane-based polymer, a photosensitive acryl carboxylic group-containing polymer, a novolac resin, an alkali soluble resin, a silicon oxide, a silicon nitride, a silicon oxynitride, a silicon oxycarbide, a silicon carbonitride, aluminum, magnesium, zinc, hafnium, zirconium, titanium, tantalum, an aluminum oxide, a titanium oxide, a tantalum oxide, a magnesium oxide, a zinc oxide, a hafnium oxide, a zirconium oxide, a titanium oxide, etc. They may be used alone or in combination.

Color conversion layers 340R and 340G and a transmissive layer 340B are disposed over the capping layer 150. The color conversion layers 340R and 340G include a red color conversion media layer 340R and a green color conversion media layer 340G. A light blocking member 372 is disposed between the neighboring red and green color conversion media layers 340R and 340G, between the red color conversion media layer 340R and the transmissive layer 340B, and between the green color conversion media layer 340G and the transmissive layer 340B. The light blocking member 372 may more effectively prevent color mixture that is generated between the adjacent color conversion media layers 340R and 340G and between the adjacent color conversion media layers 340R and 340G and the transmissive layer 340B.

A green pixel area including the green color conversion media layer 340G and a red pixel area having a configuration substantially similar to that of the green pixel area will now be described with reference to FIG. 2.

Referring to FIGS. 1 and 2, a band pass filter 350 is disposed between the capping layer 150 and the green color conversion media layer 340G. The band pass filter 350 is also disposed between the neighboring color conversion media layers 340R and 340G and between the neighboring color conversion media layers 340R and 340G and the transmissive layer 340B, and in this case, may be disposed between a second substrate 310 and a light blocking member 372 to be described below in a direction substantially perpendicular to the first substrate 50. The band pass filter 350 may more efficiently provide light that is received from the organic emission layer 1354, and may be omitted.

An auxiliary metal layer 362 is disposed between the green color conversion media layer 340G and the light blocking member 372. The auxiliary metal layer 362 may be a metal material that can reflect light, and may increase an amount of light emitted to a user by reflecting light incident on the auxiliary metal layer 362 back to the color conversion media layers 340R and 340G, the transmissive layer 340B, or the second substrate 310.

A blue light-cutting filter 322 is disposed over the green color conversion media layer 340G. The blue light-cutting filter 322 is also disposed over the red color conversion media layer 340R. The blue light-cutting filter 322 performs a function to be described below. When the organic emission layer 1354 including a material for emitting blue is used, color mixture is prevented from being generated during a process of implementing green when blue light passes through the green color conversion media layer 340G and the red color conversion media layer 340R.

The blue light-cutting filter 322 may be made of a mixture of any one of $BiO_2$, $ZnO$, and $Ce_2O_3$ and any one of $CaCO_3$, $ZrO_2$, $TiO_2$, and $Ar_2O_3$. A material for forming the blue light-cutting filter 322 is not limited to the examples described above, and any materials that can block blue light may be applied.

The green color conversion media layer 340G may convert blue light provided from the organic emission layer 1354 to green light. The green color conversion media layer 340G may include a green phosphor, and the green phosphor may be at least one of yttrium aluminum garnet (YAG), (Ca, Sr, Ba)$_2$SiO$_4$, SrGa$_2$S$_4$, BAM, α-SiAlON, β-SiAlON, Ca$_3$Sc$_2$Si$_3$O$_{12}$, Tb$_3$Al$_5$O$_{12}$, BaSiO$_4$, CaAlSiON, and (Sr$_{1-x}$Ba$_x$)Si$_2$O$_2$N$_2$. In this case, the x may be a random number between 0 and 1.

The red color conversion media layer 340R may convert blue light provided from the organic emission layer 1354 to red light. For this purpose, the red color conversion media layer 340R may include a red phosphor, and the red phosphor may be at least one of (Ca, Sr, Ba)S, (Ca, Sr, Ba)$_2$Si$_5$N$_8$, CaAlSiN$_3$, CaMoO$_4$, and Eu$_2$Si$_5$N$_8$.

In addition, the red color conversion media layer 340R and the green color conversion media layer 340G may include a color-converting quantum dot. The quantum dot may be selected from a group II-VI compound, a group III-V compound, a group IV-VI compound, a group IV element, a group IV compound, and a combination thereof.

The group II-VI compound may be selected from: a two-element compound selected from a group of CdSe, CdTe, ZnS, ZnSe, ZnTe, ZnO, HgS, HgSe, HgTe, MgSe, MgS, and a mixture thereof; a three-element compound selected from a group of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from a group of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The group III-V compound may be selected from: a two-element compound selected from a group of GaN, GaP, GaAs, GaSb, AlN, AlP, AlAs, AlSb, InN, InP, InAs, InSb, and a mixture thereof; a three-element compound selected from a group of GaNP, GaNAs, GaNSb, GaPAs, GaPSb, AlNP, AlNAs, AlNSb, AlPAs, AlPSb, InNP, InNAs, InNSb, InNAs, InPSb, GaAlNP, and a mixture thereof; and a four-element compound selected from a group of GaAlNAs, GaAlNSb, GaAlPAs, GaAlPSb, GaInNP, GaInNAs, GaInNSb, GaInNAs, GaInPSb, InAlNP, InAlNAs, InAlNSb, InAlPAs, InAlPSb, and a mixture thereof. The group IV-VI compound may be selected from: a two-element compound selected from a group of SnS, SnSe, SnTe, PbS, PbSe, PbTe, and a mixture thereof; a three-element compound selected from a group of SnSeS, SnSeTe, SnSTe, PbSeS, PbSeTe, PbSTe, SnPbS, SnPbSe, SnPbTe, and a mixture thereof; and a four-element compound selected from a group of SnPbSSe, SnPbSeTe, SnPbSTe, and a mixture thereof. The group IV element may be selected from a group of Si, Ge, and a mixture thereof. The group IV compound may be a two-element compound selected from a group of SiC, SiGe, and a mixture thereof.

In this case, the two-element compound, the three-element compound, or the four-element compound may exist in particles at a uniform concentration, or in the same particle while being divided to have partially different concentration distributions. Alternatively, it may have a core/shell structure where one quantum dot encloses another quantum dot. An interface between the core and the shell may have a concentration gradient, such that a concentration of an element existing in the shell gradually decreases closer to a center of the interface.

The quantum dot may have a full width at half maximum (FWHM) of the light-emitting wavelength spectrum that is less than about 45 nm, for example, less than about 40 nm, or less than about 30 nm. In this range, color purity or color reproducibility may be improved. In addition, since light emitted via the quantum dot is emitted in all directions, a viewing angle of light may be improved. However, depending on the embodiment, the FWHM can be less than about 45 nm.

In addition, the quantum dot is not specifically limited to have shapes that are generally used in the technical field related to the present disclosure, and more specifically, may have a shape such as a nano-particle having a spherical shape, a pyramid shape, a multi-arm shape, or a cubic shape, or may be a nanotube, a nanowire, a nanofiber, a planar nano-particle, etc.

A blue pixel area including the transmissive layer 340B will now be described with reference to FIG. 3.

The transmissive layer 340B may be made of a transparent polymer, and may transmit blue light provided from the organic emission layer 1354 to exhibit blue. The transmissive layer 340B corresponding to a region for emitting blue includes a material that emits received blue even without a separate phosphor or a quantum dot. For example, the transmissive layer 340B includes a polymer such as a photosensitive resin or $TiO_2$.

In the current exemplary embodiment, the transmissive layer 340B further includes scatterers 335. The scatterers 335 may make luminance of light emitted from the transmissive layer 340B uniform at the front and at the side. The scatterers 335 may be made of any materials that can uniformly scatter light, and as an example, may be any one of silica, $TiO_2$, $ZrO_2$, $Al_2O_3$, $In_2O_3$, ZnO, $SnO_2$, $Sb_2O_3$, and ITO. A size of the scatterer 335 may have a range of Equation 1.

$$\lambda/10 < PS_{QD} < 5\lambda \quad \text{(Equation 1)}$$

In Equation 1, $\lambda$ is a light-emitting wavelength (nanometer) of the phosphor or the quantum dot, and $PS_{QD}$ represents an aggregated particle size (nanometer) of the phosphor or the quantum dot.

As shown in FIGS. 1 and 3, the scatterers 335 are described to be included in the transmissive layer 340B, but as a modified example, the scatterers may also be included in the red color conversion media layer 340R and the green color conversion media layer 340G.

Referring to FIGS. 1 to 3, the second substrate 310 is disposed over the red color conversion media layer 340R, the green color conversion media layer 340G, and the transmissive layer 340B. Though not illustrated, a $\lambda/4$ polarizer, which prevents reflection of external light, may be further included on the second substrate 310.

Figure 6:
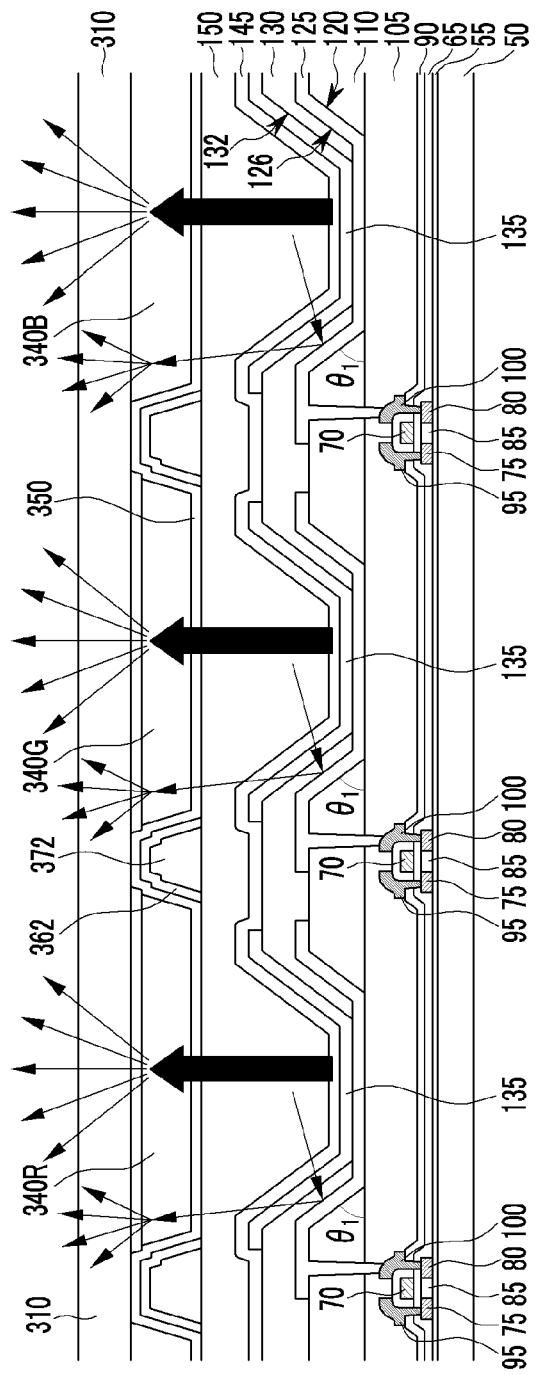
FIG. 6 is a schematic cross-sectional view of a path of light generated in an emission layer of the OLED display of FIG. 1.

FIG. 6 is a schematic cross-sectional view of a path of light generated in an emission layer of the OLED display of FIG. 1.

Referring to FIG. 6, the inclined structure included in the first electrode 125 prevents light from being totally reflected, and the light may be reflected by the first electrode 125 such that it is transmitted to the color conversion layer including the color conversion media layers 340R and 340G and the transmissive layer 340B.

Accordingly, in the OLED display according to the current exemplary embodiment, light generated from the light-emitting element layer 135 can be totally reflected between the first electrode 125 and the second electrode 145 to prevent light loss, and light-emitting efficiency can be maximized by the color conversion layer and the transmissive layer that are disposed over the organic light-emitting element. Since the color conversion layer according to the current exemplary embodiment is formed to include at least one of the phosphor and the quantum dot, color shift which is inherent in conventional OLED displays can be minimized.

Figure 7:
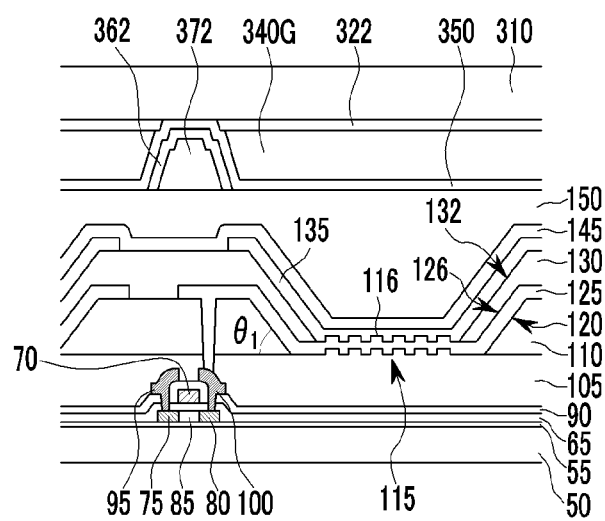
FIG. 7 is a cross-sectional view of an electrode including a protrusion-depression structure in the exemplary embodiment of FIG. 1.

FIG. 7 is a cross-sectional view of an electrode including a protrusion-depression structure in the exemplary embodiment of FIG. 1.

Referring to FIG. 7, a protrusion-depression structure 115 is formed at a surface of the insulating layer 110 that has an first inclined portion 120. Due to the protrusion-depression structure 115, a surface of the first electrode 125 may have a protrusion 116. The protrusion 116 may have various planar shapes such as circular, oval, rhombus, and triangular shapes, as well as a quadrangular shape. Since the first electrode 125 has the protrusion 116, light generated from the light-emitting element layer 135 can be reflected to further improve luminous efficiency of the OLED display.

Figure 8:
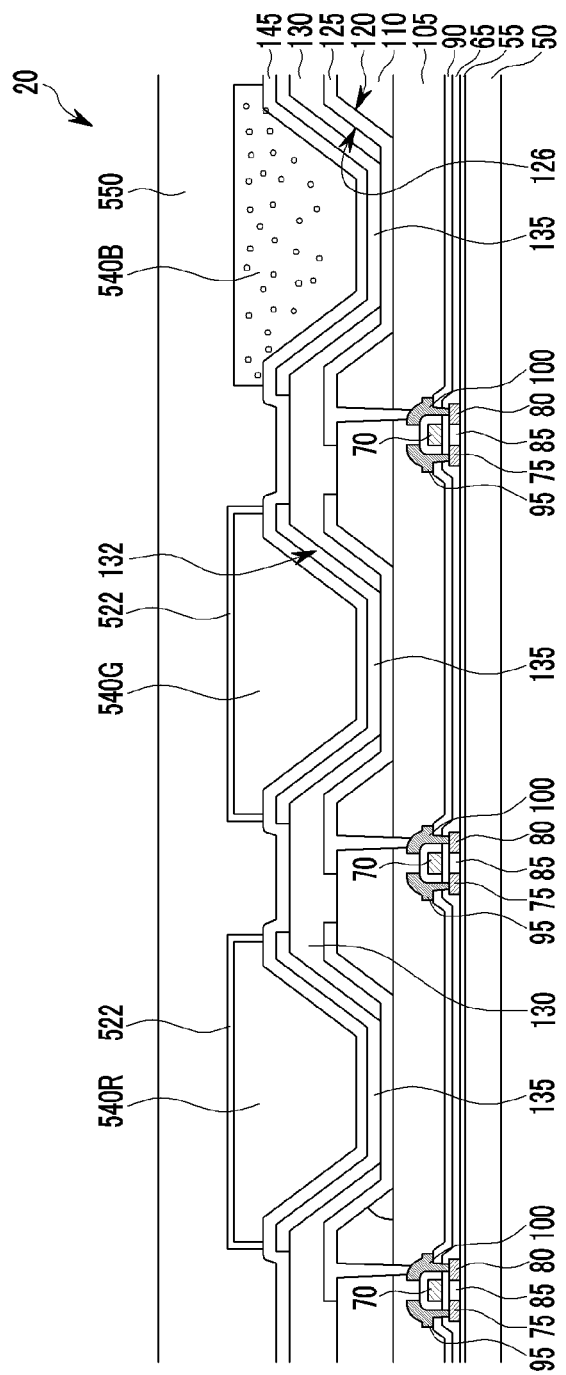
FIG. 8 is a cross-sectional view of an OLED display according to an exemplary embodiment.

FIG. 8 is a cross-sectional view of an OLED display 20 according to another exemplary embodiment. In the OLED display 20 of FIG. 8, the elements disposed between the first substrate 50 and the second electrode 145 are substantially the same as those of the OLED display 10 of FIG. 1. However, since elements including a color conversion layer and a transmissive layer are different, only differences will now be described.

Referring to FIG. 8, the color conversion layer including a red color conversion media layer 540R and a green color conversion media layer 540, and a transmissive layer 540B are disposed over the second electrode 145. Most of the color conversion layer and the transmissive layer 540B are disposed in an opening 132 between pixel defining layers 130.

A blue light-cutting filter 522 is disposed over the red color conversion media layer 540R and the green color conversion media layer 540G. A capping layer 550 is disposed over the blue light-cutting filter 522 and the transmissive layer 540B.

In addition to the differences described above, all the details described in FIGS. 1 to 7 may be applied unless they contradict the exemplary embodiment of FIG. 8.

Figure 9:
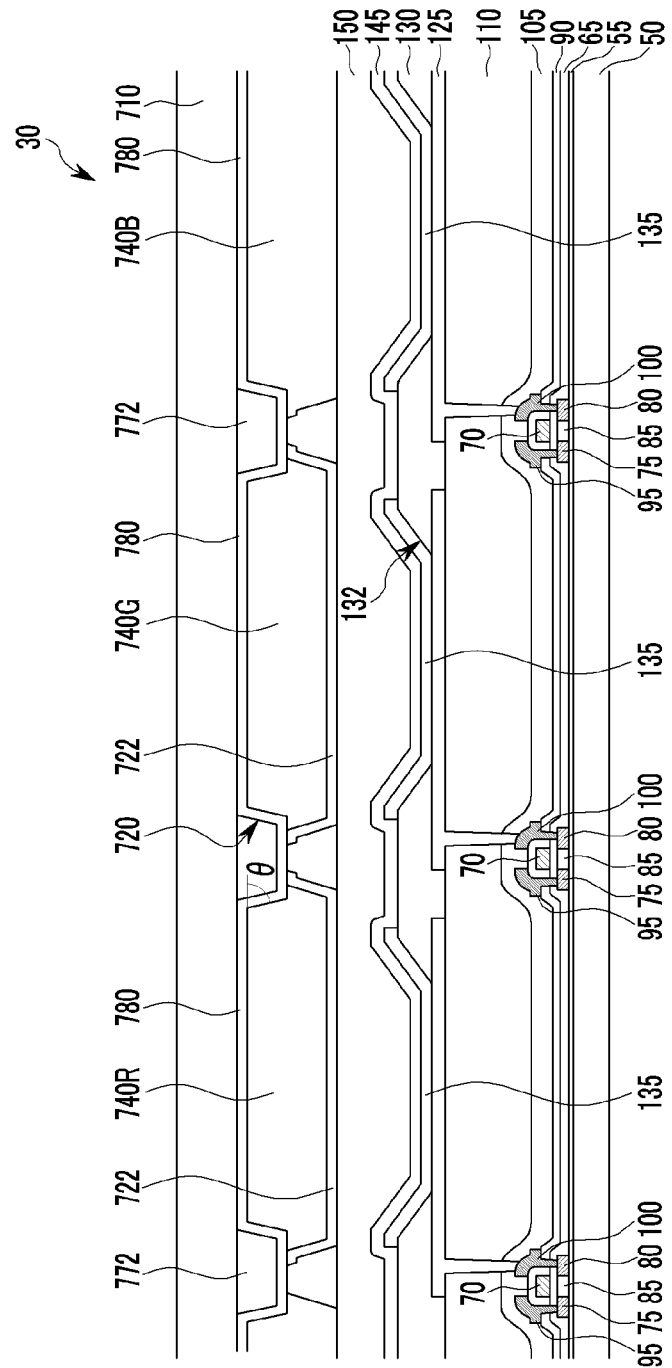
FIG. 9 is a cross-sectional view of an OLED display according to an exemplary embodiment.

FIG. 9 is a cross-sectional view of an OLED display 30 according to an exemplary embodiment. In the OLED display 30 of FIG. 9, the elements disposed between the first substrate 50 and the passivation layer 105 in a direction substantially perpendicular to the first substrate 50 are substantially the same as those of the OLED display 10 of FIG. 1. However, since elements disposed over the insulating layer 110 are different, only differences will now be described.

Referring to FIG. 9, a top surface of the insulating layer 110 may not have an inclined portion but may have a structure that is smooth in most of the region. An organic light-emitting element, which includes first and second electrodes 125 and 145 and a light-emitting element layer 135, is disposed over an insulating layer 110. Specifically, the first electrode 125 is disposed over the insulating layer 110, and the first electrode 125 may have a structure that is smooth based on a surface substantially parallel to the first substrate 50. The first electrode 125 may include a transparent conductive material for bottom emission to be described below. For example, the first electrode 125 may include an indium tin oxide, an indium zinc oxide, a zinc tin oxide, a zinc oxide, a tin oxide, a gallium oxide, etc. They may be used alone or in combination.

A pixel defining layer 130 is disposed over the insulating layer 110 and the first electrode 125, and an opening 132 exposing some of the first electrode 125 is formed in the pixel defining layer 130. A side surface of the pixel defining layer 130 formed the by opening 132 may have an inclined structure, and a light-emitting element layer 135 is disposed in the opening 132. The second electrode 145 is disposed over the light-emitting element layer 135, and the second electrode 145 may include a transparent conductive material.

A capping layer 150 is disposed over the second electrode 145. A color conversion layer including a red color conversion media layer 740R and a green color conversion media layer 740G, and a transmissive layer 740B are disposed over the capping layer 150. A light blocking member 772 is disposed between the adjacent red and green color conversion media layers 740R and 740G, between the red color conversion media layer 740R and the transmissive layer 740B, and between the green color conversion media layer 740G and the transmissive layer 740B. A blue light-cutting filter 722 may be disposed between the red color conversion media layer 740R and the capping layer 150 and between the green color conversion media layer 740G and the capping layer 150.

The OLED display 30 includes a reflective metal layer 780 on top of the red and green color conversion media layers 740R and 740G and the transmissive layer 740B. The reflective metal layer 780 includes a material that has a reflective property. For example, the reflective metal layer 780 may include a metal such as aluminum (Al), silver (Ag), platinum (Pt), gold (Au), chromium (Cr), tungsten (W), molybdenum (Mo), titanium (Ti), palladium (Pd), or iridium (Ir), and an alloy thereof. They may be used alone or in combination. In addition, the reflective metal layer 780 may be formed to have a single-layered structure or a multi-layered structure including the metal and/or the alloy thereof described above. Alternatively, the reflective metal layer 780 may have a triple layer structure of silver (Ag)/indium tin oxide (ITO)/silver (Ag).

In the current exemplary embodiment, the reflective metal layer 780 has an inclined portion 720. The inclined portion 720 may be disposed between the light blocking member 772 and the red color conversion media layer 740R, between the light blocking member 772 and the green color conversion media layer 740G, and between the light blocking member 772 and the transmissive layer 740B. In this case, the inclined portion 720 has an inclination angle θ, and the inclination angle θ may be greater than 0 degrees and smaller than 90 degrees. The reflective metal layer 780 having the inclined portion 720 reflects light emitted from the red and green color conversion media layers 740R and 740G and the transmissive layer 740B, thereby further improving efficiency of light finally emitted in a direction toward the first substrate 50 from a second substrate 710 to be described below.

The second substrate 710 is disposed over the reflective metal layer 780.

In addition to the differences described above, all the details described in FIGS. 1 to 7 may be applied unless they contradict the exemplary embodiment of FIG. 9.

Figure 10:
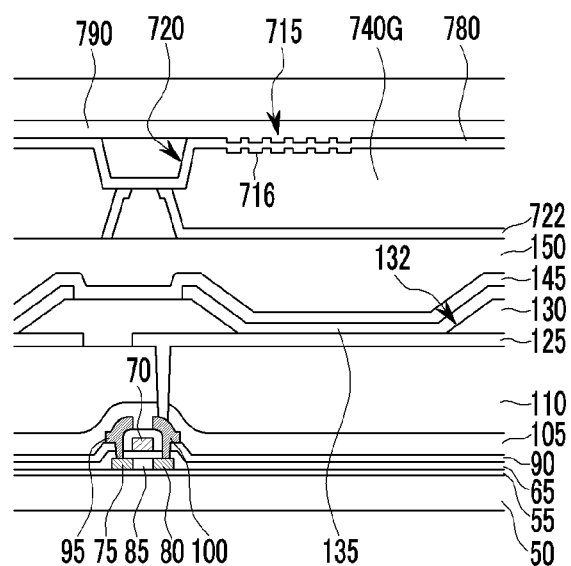
FIG. 10 is a cross-sectional view of a reflective metal layer including a protrusion-depression structure in the exemplary embodiment of FIG. 9.

FIG. 10 is a cross-sectional view of a reflective metal layer including a protrusion-depression structure in the exemplary embodiment of FIG. 9.

Referring to FIG. 10, a plurality of protrusions 716 are formed at a surface of a reflective metal layer 780 having an inclined portion 720. In order to form the protrusions 716, an auxiliary layer 790 having a protrusion-depression structure 715 may be further included between a second substrate 710 and the reflective metal layer 780. The auxiliary layer 790 may be an organic material.

Since the reflective metal layer 780 has the protrusions 716, light emitted from the red color conversion media layer 740R, the green color conversion media layer 740G, and the transmissive layer 740B can be reflected, thereby further improving luminous efficiency of the OLED display.

While the inventive technology has been described in connection with exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light-emitting diode (OLED) display comprising:
    a first substrate;
    a transistor disposed on the first substrate;
    an insulating layer disposed over the first substrate and the transistor and including a first inclined portion;
    a first electrode disposed over the insulating layer;
    a light-emitting element layer disposed over the first electrode;
    a second electrode disposed over the light-emitting element layer; and
    a color conversion layer and a transmissive layer disposed over the second electrode,
    wherein the first electrode includes a pair of adjacent second inclined portions inclined so as to face each other while facing away from the first substrate, the light-emitting element layer being located between the pair of adjacent second inclined portions and including a pair of adjacent third inclined portions inclined so as to face each other while facing away from the first substrate, a second inclined portion of the pair of adjacent second inclined portions being disposed over and inclined along the first inclined portion of the insulating layer, and the pair of adjacent third inclined portions being disposed over and inclined along the pair of adjacent second inclined portions,
    wherein the insulating layer has an opening overlapping the transistor,
    the first electrode contacts the transistor through the opening, and
    an area of the first electrode not overlapping the opening is disposed closer to the first substrate than an area of the first electrode overlapping the opening, and
    wherein the entire area of the second inclined portions is overlapped by the third inclined portions in a direction perpendicular to the first substrate.

2. The OLED display of claim 1, further comprising a passivation layer disposed between the first substrate and the insulating layer, wherein the second inclined portion extends such that the first electrode is disposed over the passivation layer.

3. The OLED display of claim 1, further comprising a pixel defining layer disposed over the insulating layer, wherein the pixel defining layer overlaps a side surface of the first inclined portion in the depth dimension of the OLED display.

4. The OLED display of claim 3, wherein the pixel defining layer includes a plurality of scattering particles having a nano-structure that are dispersed.

5. The OLED display of claim 4, wherein the scattering particles include at least one selected from the group consisting of inorganic particles and polymer particles.

6. The OLED display of claim 1, wherein at least one of the first and second inclined portions has an acute inclination angle with respect to the first substrate.

7. The OLED display of claim 1, wherein the first electrode includes a reflecting electrode.

8. The OLED display of claim 7, wherein the first electrode includes a plurality of protrusions.

9. The OLED display of claim 8, wherein the insulating layer includes a protrusion-depression structure that corresponds to the protrusions of the first electrode.

10. The OLED display of claim 1, wherein the color conversion layer includes at least one of a quantum dot and a phosphor.

11. The OLED display of claim 10, wherein the color conversion layer includes a red color conversion media layer and a green color conversion media layer, and wherein the color conversion layer further includes a light blocking member that is disposed between the red and green color conversion media layers, between the red color conversion media layer and the transmissive layer, and between the green color conversion media layer and the transmissive layer.

12. An organic light-emitting diode (OLED) display comprising:
a first substrate;
an insulating layer disposed over the first substrate and including a first inclined portion;
a first electrode disposed over the insulating layer;
a light-emitting element layer disposed over the first electrode;
a second electrode disposed over the light-emitting element layer; and
a color conversion layer and a transmissive layer disposed over the second electrode,
wherein the first electrode includes a second inclined portion disposed over and inclined along the first inclined portion of the insulating layer,
wherein the color conversion layer includes at least one of a quantum dot and a phosphor,
wherein the color conversion layer includes a red color conversion media layer and a green color conversion media layer, and wherein the color conversion layer further includes a light blocking member that is disposed between the red and green color conversion media layers, between the red color conversion media layer and the transmissive layer, and between the green color conversion media layer and the transmissive layer, and
the OLED display further comprising a blue light-cutting filter overlapping the red and green color conversion media layers in the depth dimension of the OLED display.

13. The OLED display of claim 12, wherein the light-emitting element layer includes a plurality of blue emission layers that respectively correspond to the red and green color conversion media layers and the transmissive layer.

14. The OLED display of claim 13, wherein the red and green color conversion media layers respectively include at least one of the quantum dot and the phosphor, and wherein the transmissive layer does not include the quantum dot and the phosphor.

15. The OLED display of claim 14, wherein at least one of the red and green color conversion media layers and the transmissive layer includes a plurality of scatterers.

16. The OLED display of claim 1, further comprising a capping layer disposed between the second electrode and the color conversion layer and between the second electrode and the transmissive layer.

17. The OLED display of claim 16, further comprising a second substrate disposed over the color conversion layer and the transmissive layer.

18. The OLED display of claim 1, further comprising a pixel defining layer disposed over the insulating layer, wherein the color conversion layer and the transmissive layer are disposed between portions of the pixel defining layer.

19. The OLED display of claim 1, wherein the light-emitting element layer includes a blue emission layer that has a tandem structure.

20. An OLED display comprising:
a first substrate;
an insulating layer disposed over the first substrate;
an organic light-emitting element disposed over the insulating layer;
a color conversion layer and a transmissive layer disposed over the organic light-emitting element; and
a reflective metal layer disposed entirely over a top surface of the color conversion layer and a top surface of the transmissive layer, the color conversion layer and the transmissive layer being disposed between the organic light-emitting element and the reflective metal layer, wherein the reflective metal layer includes an inclined portion,
wherein the organic light-emitting element includes a light-emitting element layer, and the light-emitting element layer includes an inclined portion.

21. The OLED display of claim 20, wherein the color conversion layer includes a red color conversion media layer and a green color conversion media layer, and wherein the color conversion layer further includes a light blocking member disposed between the red and green color conversion media layers, between the red color conversion media layer and the transmissive layer, and between the green color conversion media layer and the transmissive layer.

22. The OLED display of claim 21, wherein the inclined portion of the reflective metal layer is disposed between the light blocking member and the red color conversion media layer, between the light blocking member and the green color conversion media layer, and between the light blocking member and the transmissive layer.

23. An OLED display comprising:
a first substrate;
an insulating layer disposed over the first substrate;
an organic light-emitting element disposed over the insulating layer;
a color conversion layer and a transmissive layer disposed over the organic light-emitting element; and
a reflective metal layer disposed over the color conversion layer and the transmissive layer, wherein the reflective metal layer includes an inclined portion,
wherein the color conversion layer includes a red color conversion media layer and a green color conversion media layer, and wherein the color conversion layer further includes a light blocking member disposed between the red and green color conversion media layers, between the red color conversion media layer and the transmissive layer, and between the green color conversion media layer and the transmissive layer, wherein the inclined portion of the reflective metal layer is disposed between the light blocking member and the red color conversion media layer, between the light blocking member and the green color conversion media layer, and between the light blocking member and the transmissive layer, the OLED display further comprising a blue light-cutting filter overlapping the red and green color conversion media layers in the depth dimension of the OLED display.

24. The OLED display of claim 23, further comprising a second substrate disposed over the light blocking member and the reflective metal layer.

25. The OLED display of claim 24, wherein the organic light-emitting element includes a light-emitting element layer, and wherein the light-emitting element layer includes a plurality of blue emission layers that respectively correspond to the red and green color conversion media layers and the transmissive layer.

26. The OLED display of claim 25, wherein the red and green color conversion media layers respectively include at least one of a quantum dot and a phosphor, and wherein the transmissive layer does not include the quantum dot and the phosphor.

27. The OLED display of claim 26, wherein at least one of the red and green color conversion media layers and the transmissive layer includes a plurality of scatterers.

28. An OLED display comprising:
a first substrate;
an insulating layer disposed over the first substrate;
an organic light-emitting element disposed over the insulating layer;
a color conversion layer and a transmissive layer disposed over the organic light-emitting element; and
a reflective metal layer disposed over the color conversion layer and the transmissive layer, wherein the reflective metal layer includes an inclined portion,
wherein the reflective metal layer includes a plurality of protrusions.

29. The OLED display of claim 28, further comprising an auxiliary layer disposed over the reflective metal layer, wherein the auxiliary layer includes a protrusion-depression structure that corresponds to the protrusions.

30. The OLED display of claim 20, wherein the organic light-emitting element includes:
a first electrode disposed over the insulating layer;
the light-emitting element layer disposed over the first electrode; and
a second electrode disposed over the light-emitting element layer,
wherein the insulating layer has a smooth top surface.

* * * * *